United States Patent [19]
Ware et al.

[11] Patent Number: 5,844,855
[45] Date of Patent: Dec. 1, 1998

[54] METHOD AND APPARATUS FOR WRITING TO MEMORY COMPONENTS

[75] Inventors: Frederick A. Ware, Los Altos; John B. Dillon; Richard M. Barth, both of Palo Alto; Billy Wayne Garrett, Jr., Mountain View; John Girdner Atwood, Jr., San Jose; Michael P. Farmwald, Portola Valley; Richard DeWitt Crisp, Cupertino, all of Calif.

[73] Assignee: Rambus, Inc., Mountain View, Calif.

[21] Appl. No.: 858,014

[22] Filed: May 16, 1997

Related U.S. Application Data

[62] Division of Ser. No. 389,561, Feb. 14, 1995, Pat. No. 5,680,361, which is a continuation of Ser. No. 76,388, Jun. 14, 1993, abandoned.

[51] Int. Cl.$^6$ .................................................. G11C 14/401
[52] U.S. Cl. ............................... 365/230.01; 365/230.04; 365/230.08; 365/238.5
[58] Field of Search ........................ 365/230.01, 230.04, 365/230.05, 230.08, 238.5

[56] References Cited

U.S. PATENT DOCUMENTS

| | | | |
|---|---|---|---|
| 4,727,363 | 2/1988 | Ishii | 40/724 |
| 4,823,119 | 4/1989 | Ishii | 340/703 |
| 4,899,310 | 2/1990 | Baba et al. | 365/230.03 |
| 4,912,658 | 3/1990 | Sfarti et al. | 364/521 |
| 4,999,620 | 3/1991 | Ishii | 340/799 |
| 5,109,348 | 4/1992 | Pfeiffer et al. | 395/164 |
| 5,134,589 | 7/1992 | Hamano | 365/238.5 |
| 5,148,396 | 9/1992 | Nakada | 365/189.03 |
| 5,282,177 | 1/1994 | McLaury | 365/230.05 |
| 5,319,606 | 6/1994 | Bowen et al. | 365/230.06 |
| 5,680,361 | 10/1997 | Wane et al. | 365/230.01 |

FOREIGN PATENT DOCUMENTS

| | | |
|---|---|---|
| 0385389 | 9/1990 | European Pat. Off. . |
| 0496002 | 7/1992 | European Pat. Off. . |
| 62-071386 | 4/1987 | Japan . |
| 3-205681 | 9/1991 | Japan . |
| 5-6661 | 1/1993 | Japan . |
| 5-28089 | 2/1993 | Japan . |
| 5144259 | 6/1993 | Japan . |

OTHER PUBLICATIONS

Patent Abstracts of Japan, vol. 12, No. 43 (P–664) & JP,A,62 191 971 (Feb. 9, 1988).
Patent Abstracts of Japan, vol. 12, No. 307 (P–747) & JP,A,63 076 195 (Aug. 22, 1988).
Patent Abstracts of Japan, vol. 16, No. 252 (P–1367) & JP,A,04 060 586 (Jun. 9, 1992).
International Preliminary Examining Authority, PCT International Preliminary Examination Report, dated Aug. 24, 1995 for PCT application no. PCT/US94/06157.
International Preliminary Examining Authority, PCT International Preliminary Examination Report, dated May 12, 1995 for PCT application no. PCT/US94/06157.

*Primary Examiner*—Viet Q. Nguyen
*Attorney, Agent, or Firm*—Blakely, Sokoloff, Taylor & Zafman LLP

[57] ABSTRACT

Additional operating modes are provided to enhance the functionality and performance of a memory system. In one embodiment, a unique bit mask is supplied with the write data used in each column access. In an alternate embodiment, a bit mask register and byte mask register are provided to support bit level and byte level masking. The bit mask and write data registers are realized as a single register to provide the functionality while minimizing component space and cost. In another embodiment, a separate bit mask and byte mask are provided. The byte mask is loaded with mask data in one cycle and is used during the next "q" column write accesses. This structure provides for operating modes with no bit masking, with bit masks supplied for every row access, and with bit masks supplied with every column access. In order to enhance the functionality of a system, such as a two-dimensional graphics system, in an alternate embodiment, the memory system is provided with two registers and a select control line to select data from one of two registers. In a computer graphics system, this is used to select between foreground and background colors. The embodiment can be utilized in conjunction with the other embodiments described to provide enhanced functionality and performance.

45 Claims, 16 Drawing Sheets

FIG. 2 (Prior Art)

| Term | Description |
| --- | --- |
| Address | The wires used to send the row and column addresses from the controller to the memory component. |
| Data | The wires used to send the write data from the controller to the memory component, or to return the read data to the controller. |
| Control | The wires used to send the control information from the controller to the memory component. This includes signals such as RAS (row address strobe), CAS (column address strobe), CS (chip select), and WE (write enable). |
| a | Number of external Address wires received by the memory component. |
| ar | Number of row Address wires received by the memory component to perform an access. |
| ac | Number of column Address wires received by the memory component to perform an access. |
| c | Number of Control wires received by the memory component. |
| b | The number of bits in a byte of information (typically eight or nine). |
| m | Number of bytes of Data wires received (or transmitted) by the memory component. |
| WriteEnable | The wires used to send the writeenable information to the Sense Amps. |
| WriteData | The wires used to send the writedata information to the Sense Amps. |

FIG. 4 (Prior Art)

| Number | Mode | Description |
|---|---|---|
| 1 | SelWD = 0<br>SelbM = 2<br>LoadWD not used<br>LoadbM not used | This mode permits operation that is equivalent to the previous example; that is, the Receiver Data is placed onto the WriteData inputs of the Memory Array, and the WriteEnable inputs are controlled with the "m" Byte Enable controls. |
| 2 | SelWD = 0<br>SelbM = 1<br>LoadWD not used<br>LoadbM = 1 | This mode permits the BitMask register to be loaded and then used repeatedly for different WriteData (held in the Data receivers) on successive column write operations. |
| 6 | SelWD = 1<br>SelbM = 0<br>LoadWD = 1<br>LoadbM = not used | This mode permits the WriteReg register to be loaded and then used repeatedly with different BitMasks (held in the Data receivers) on successive column write operations. |

FIG. 7 (Prior Art)

| Address | Row[a] | Col[a,1] | Col[a,2] | ... | Col[a,n] | Row[b] | Col[b,0] |
|---|---|---|---|---|---|---|---|
| Data | WData[a] | BitMask[a,1] | BitMask[a,2] | | BitMask[a,n] | WData[b] | BitMask[b,0] |
| Control | | | | | | | |
| LoadRowAddr | 1 | 0 | 0 | | 0 | 1 | 0 |
| LoadColAddr | 0 | 1 | 1 | | 1 | 0 | 1 |
| LoadWD | 1 | 0 | 0 | | 0 | 1 | 0 |
| LoadbM | 0 | 0 | 0 | | 0 | 0 | 0 |
| SelWD | 1 | 1 | 1 | | 1 | 1 | 1 |
| SelBM | 0 | 0 | 0 | | 0 | 0 | 0 |

Time →

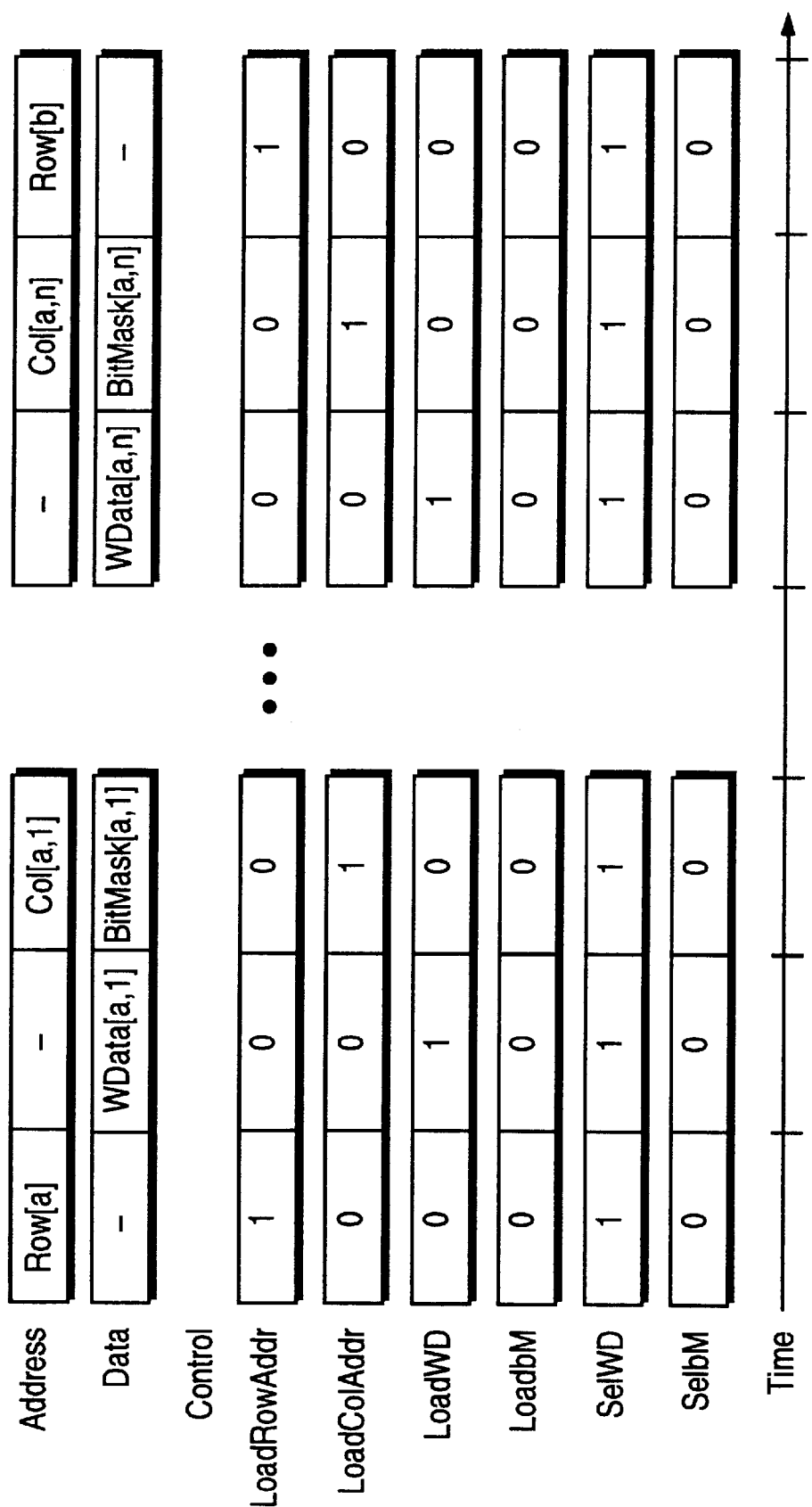

FIG. 12

| Address | Row[a] | – | Col[a,1] | ... | Col[a,q] | – | Col[b,1] |
|---|---|---|---|---|---|---|---|
| Data | – | ByteMask[a] | WData[a,1] | ... | WData[a,q] | ByteMask[b] | WData[b,1] |
| LoadRowAddr | 1 | 0 | 0 | | 0 | 0 | 0 |
| LoadColAddr | 0 | 0 | 1 | | 1 | 0 | 1 |
| LoadbM | 0 | 0 | 0 | | 0 | 0 | 0 |
| LoadBM | 0 | 1 | 0 | | 0 | 1 | 0 |
| SelWD | x | x | 0 | | 0 | x | 0 |
| SelbM | x | x | 2 | | 2 | x | 2 |
| SelBM | x | x | 1 | | q | x | 1 |

FIG. 15

| Number | ByteMask | BitMask | WDataF | WDataB | WSelect |
|---|---|---|---|---|---|
| 1(prior art) | Control Input | 1..1 | Data Input | Not Used | Not Used |
| 2(prior art) | Control Input | Register | Data Input | Not Used | Not Used |
| 3 | Control Input | Data Input | Data Input | Not Used | Not Used |
| 4 | Control Input | 1..11 | Register | Not Used | Not Used |
| 5 | Control Input | Register | Register | Not Used | Not Used |
| 6 (prior art) | Control Input | Data Input | Register | Not Used | Not Used |
| 7 | Control Input | Data Input | Data Input | Not Used | Not Used |
| 8 | Control Input | Data Input | Data Input | Not Used | Not Used |
| 11-18 | Register | as above | as above | Not Used | Not Used |
| 21-28 | Data Input | as above | as above | Not Used | Not Used |
| 101 | Control Input | 1..11 | Register | Register | Data Input |
| 102 | Control Input | Register | Register | Register | Data Input |
| 107 | Control Input | Data Input | Register | Register | Data Input |
| 108 | Control Input | Data Input | Register | Register | Data Input |
| 111 | Register | 1..11 | Register | Register | Data Input |
| 112 | Register | Register | Register | Register | Data Input |
| 117 | Register | Data Input | Register | Register | Data Input |
| 118 | Register | Data Input | Register | Register | Data Input |
| 121 | Data Input | 1..11 | Register | Register | Data Input |
| 122 | Data Input | Register | Register | Register | Data Input |
| 127 | Data Input | Data Input | Register | Register | Data Input |
| 128 | Data Input | Data Input | Register | Register | Data Input |
| 201-228 | as above | as above | Register | Data Input | Register |
| 301-328 | as above | as above | Data Input | Register | Register |
| 401-428 | as above | as above | Data Input | Data Input | Register |
| 501-528 | as above | as above | Data Input | Register | Data Input |
| 601-628 | as above | as above | Data Input | Data Input | Data Input |

METHOD AND APPARATUS FOR WRITING TO MEMORY COMPONENTS

This application is a division of Ser No. 08/389,561, filed Feb. 14, 1995, now U.S. Pat. No. 5,680,361, which is a continuation of Ser. No. 08/076,388, filed Jul. 14, 1993, now abandoned.

BACKGROUND OF THE INVENTION

1. Field of the Invention

The present invention relates to the control of data to be written to memory components. More particularly, the present invention relates to a structure and method for implementing bit and byte enable signals and logic during write operations to memory components.

2. Art Background

FIG. 1 shows some of the common features of modern solid-state memory components. The memory components contain a two dimensional array of storage cells. These storage cells may be static (i.e. there is a bistable latch) or dynamic (i.e. there is a single capacitor holding a charge). A row of storage cells is read when a row address is applied to the row decoder and the appropriate read control signals are asserted. This entire row is held in a row of column amplifiers (sense amplifiers) which are typically static in nature. Any subset of this sensed row may be accessed via column addresses and control signals.

A write operation requires additional control. It is important to be able to write to a subset of a row. This is typically done as a two step process (although in a static memory component it may be done as a single step). The information to be written is placed on the write data signal lines. The write enable signal is asserted for only those bits of a row which have been selected by the column select circuitry and which are to be modified. Write enable signals are not asserted for the remaining bits. The Read/Write Column signal is then asserted, permitting those sense amplifiers of the row with the write enable signal asserted to be modified with the write data received across the write data signal lines. Subsequently, using the write row signals, the entire row may be rewritten from the column amplifiers back to the RAM array, with the subset of the storage cells modified according to the modified bits in the column amplifiers.

This technique works because the sense amplifier retains previous data written to the sense amplifier if the two write drivers driven by the write enable are allowed to float (write enable is not asserted). Although internally there is typically a write enable signal for each bit of write data, these signals are not available externally; therefore, most memory components are incapable of modifying any pattern of bits within a row.

FIG. 3 shows an example of a prior art memory component with byte enable controls for write masking. FIG. 3, and succeeding figures, use the notation set forth in FIG. 2.

In the prior art memory components, the value of m is typically one or two. The memory array 110 and the data receiver 115 typically transact the same quantum of information (m*b bits). There are typically "m" write enable signals for masking the individual bytes of write data within this transaction quantum, where m represents the number of bytes of data communicated by the memory component. The masking is controlled by the byte enable controls 120. The copy block duplicates the bit on the one input ire onto the "b" output wires.

FIGS. 4 and 5 illustrate another example of prior art in which the memory component includes a bit enable register (BitMask) 180 and write data register (WriteReg) 185. In addition to the byte enable control lines shown in the previous example of FIG. 3, two loadable internal registers, BitMask 180 and WriteReg 185 are connected to the receiver 190 for the data lines 195. Two multiplexers 200, 205 are provided for selecting the receiver 190 contents (the receivers typically have register or latch storage elements) or the contents of the two loadable registers 180, 185 for input to the write enable 210 and write data 215 input pins of the memory array 220.

As set forth in FIG. 4, this configuration permits several modes of operation. The first mode provides the functionality of the previous example set forth in FIG. 3. The second and sixth modes provide additional functionality.

FIG. 6 illustrates a simplified timing diagram for the second mode. It should be noted that the signals for the row and column portions of the address are multiplexed together. In a typical operation, a row address is received and latched by the memory component, and followed by multiple column addresses in subsequent clock cycles to access the sensed row. Referring to FIGS. 5 and 6, when the row address Row[a] is received on the address lines 225, the BitMask[a] value is also received on the data lines 195. The BitMask[a] value is latched by the bit mask register 180, and is used to perform bit masking on incoming data until a new value is received to overwrite it.

When each column address Col[a,i] is received on the address lines 225, the WData[a,i] value is also received on the data lines 195. This value is held in the receiver 190, and is used to drive the write data inputs 215 of the memory array 220. This is repeated for "n" different values of WData, using the same value of BitMask stored in the bit mask register 180. When the next row address Row[b] is received on the Address lines 225, a new BitMask[b] value is also received on the data lines 195. A second series of column write operations is then performed with the new bit mask value.

FIG. 7 shows a simplified timing diagram for Mode Six. Referring to FIGS. 5 and 7, when the row address Row[a] is received on the address lines 225, the WData[a] value is also received on the data lines 195. This value is latched by the WriteReg register 185, and is used until a new WData value is received and overwrites the value in the register 185. Thus, when each column address Col[a,i] is received on the address lines 225, the BitMask[a,i] value is also received on the data lines 195. This value is held in the receiver 190, and subsequently drives the Write enable inputs 210 of the Memory Array 220. This is repeated for "n" different values of the bit mask, using the same value stored in the WriteReg 185.

When the next row address Row[b] is received on the address lines 225, a new WData[b] value is also received on the data lines 195. A second series of column write operations is then performed using the new WData[b] value.

SUMMARY OF THE INVENTION

It is an object of the present invention to provide a sophisticated level of bit and byte masking in a memory system.

It is an object of the present invention to provide a memory system which can receive a new bit mask with each "m*b" bits of write data sent to the memory array.

In the memory system of the present invention, additional operating modes are provided to enhance the functionality and performance of the memory system. In one embodiment, a unique bit mask is supplied with the write data used in each column access. In an alternate embodiment, a bit mask register and byte mask register are provided to support bit level and byte level masking. Alternatively, the bit mask and write data Register are realized as a single register to provide the same functionality. These two registers are realized as a single register to provide the functionality while minimizing component space and cost.

In another embodiment, a separate bit mask and byte mask are provided. The byte mask is loaded with mask data in one cycle and is used during the next "b" column write accesses. This structure provides for operating modes with no bit masking, with bit masks supplied for every row access and with bit masks supplied with every column access.

In order to enhance the functionality of a system, such as a two-dimensional graphics system, in an alternate embodiment, the memory system is provided with two registers and a select control line to select data from one of two registers. In a computer graphics system, this is used to select between foreground and background colors. The embodiment can be utilized in conjunction with the other embodiments described to provide enhanced functionality and performance.

BRIEF DESCRIPTION OF THE DRAWINGS

The objects, features and advantages of the present invention will be apparent from the following detailed description in which:

FIG. 2 is a table which sets forth the notation for the block diagrams shown.

FIG. 4 is a table illustrating the possible operating modes in the prior art memory system of FIG. 5.

FIGS. 6 and 7 are illustrations of the timing for two modes of the prior art memory system of FIG. 5.

FIGS. 9a and 9b illustrate the timing for two modes of the memory system of the present invention.

FIG. 12 illustrates the timing for one mode of the memory system of the present invention illustrated in FIG. 11.

FIG. 15 is a table summarizing the operating modes available for the different embodiments of the memory system of the present invention.

DETAILED DESCRIPTION OF THE INVENTION

In the following description, for purposes of explanation, numerous details are set forth in order to provide a thorough understanding of the present invention. However, it will be apparent to one skilled in the art that these specific details are not required in order to practice the present invention. In other instances, well known electrical circuits and structures are shown in block diagram form in order not to obscure the present invention unnecessarily.

Figure 1:
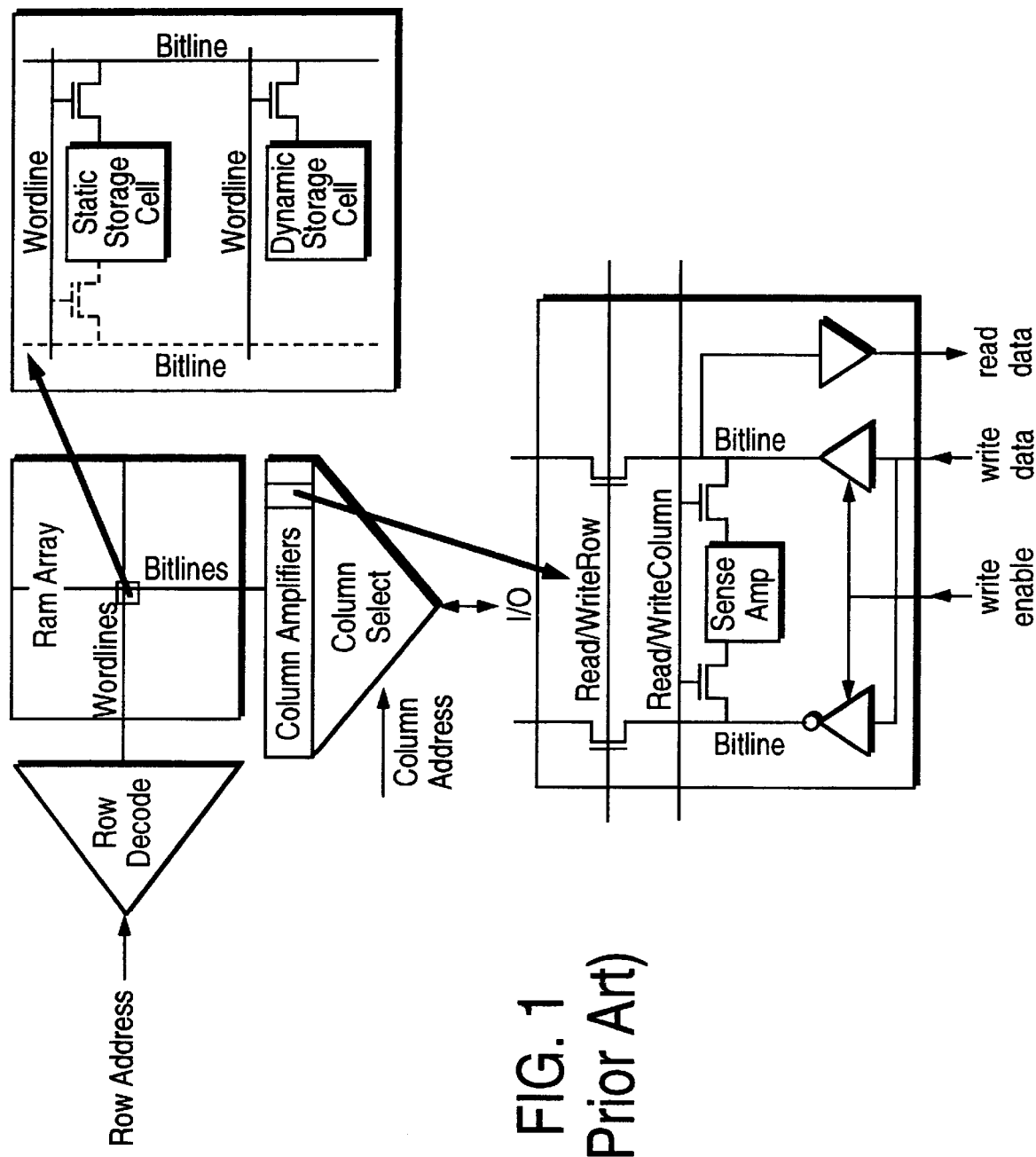
FIG. 1 is a block diagram illustration of the internal structure of a memory component.
Figure 3:
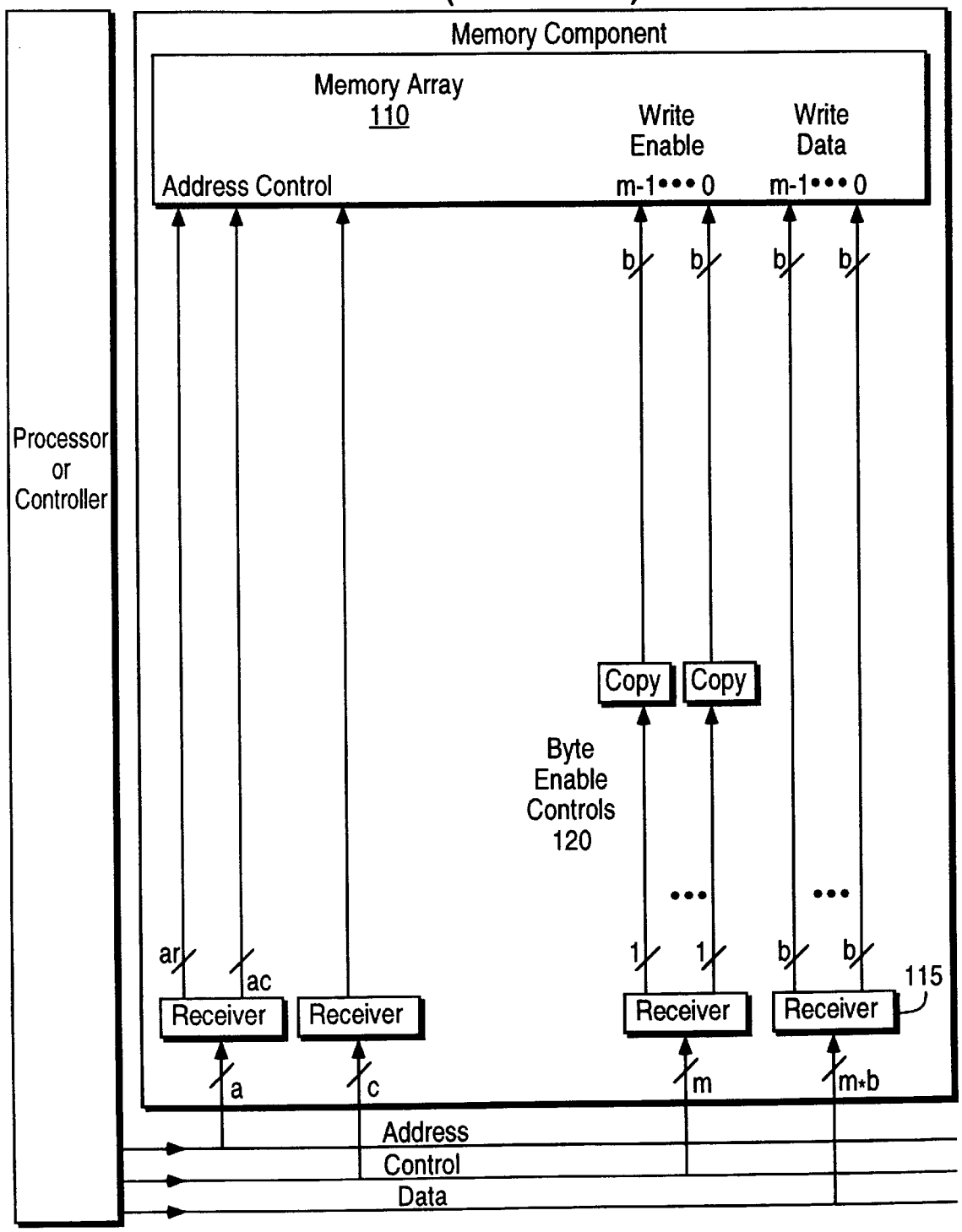
FIG. 3 is a block diagram illustration of a prior art memory system with byte enable control.
Figure 5:
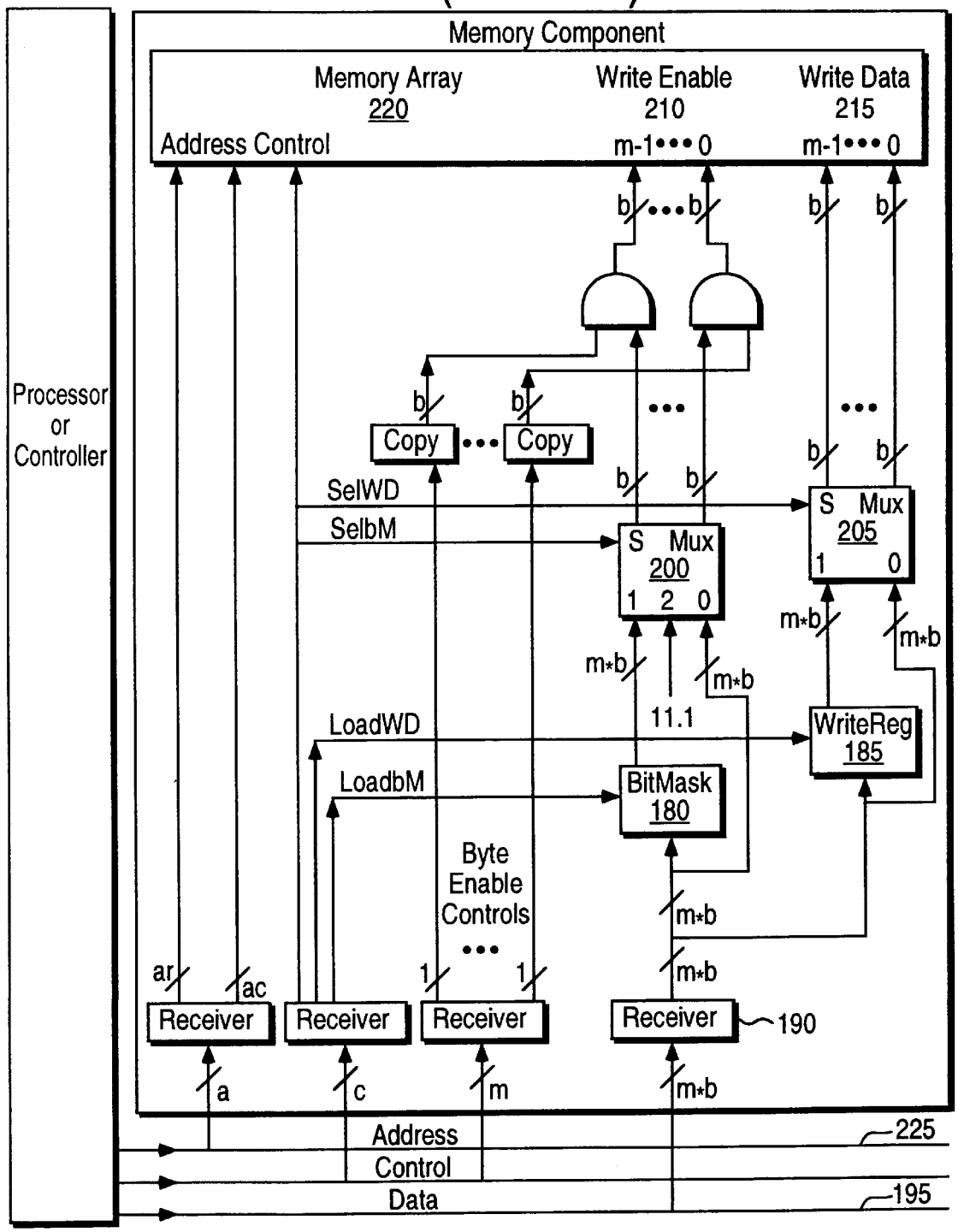
FIG. 5 is a block diagram illustration of a prior art memory system with a bit enable register.
Figure 6:
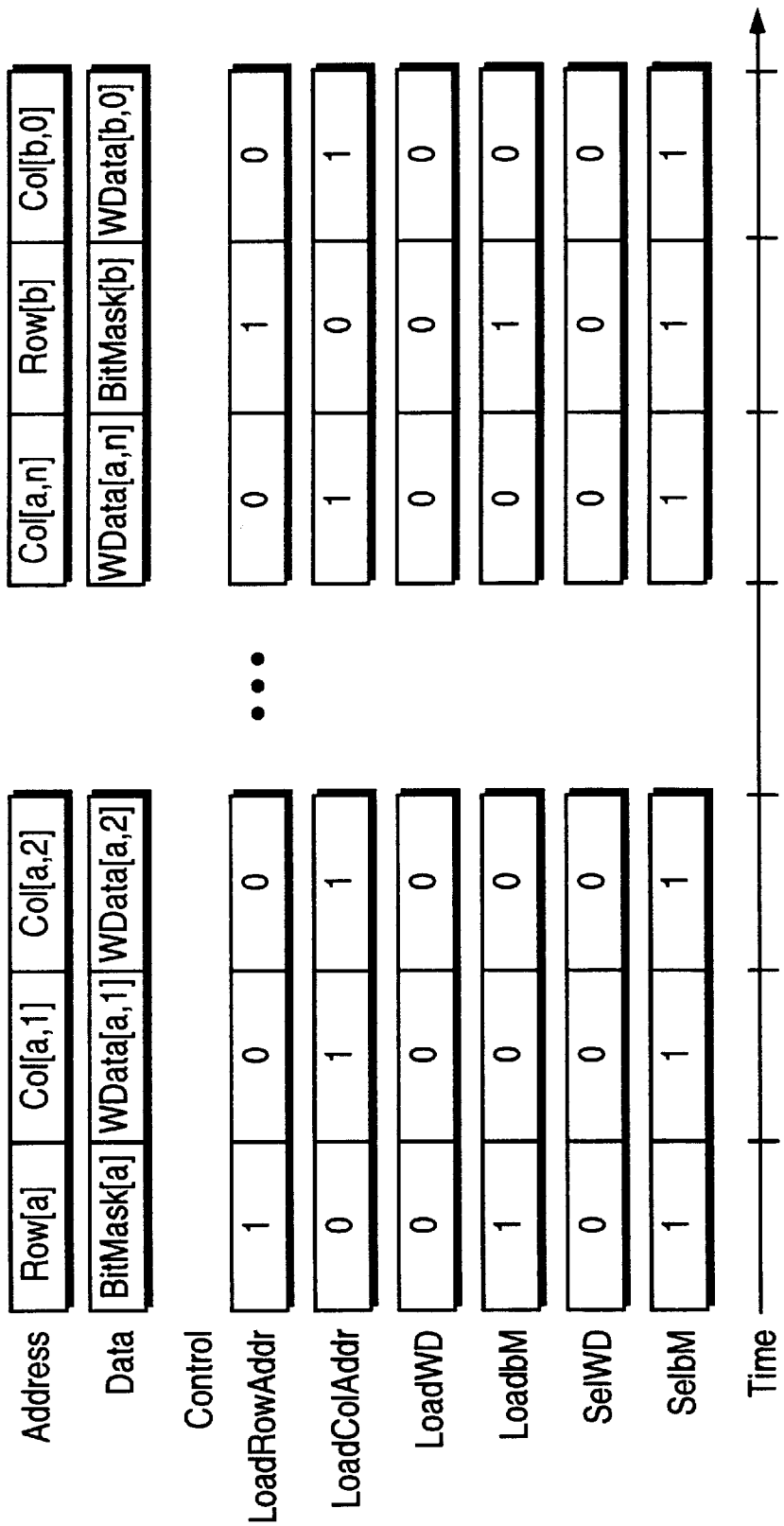
Figure 8:
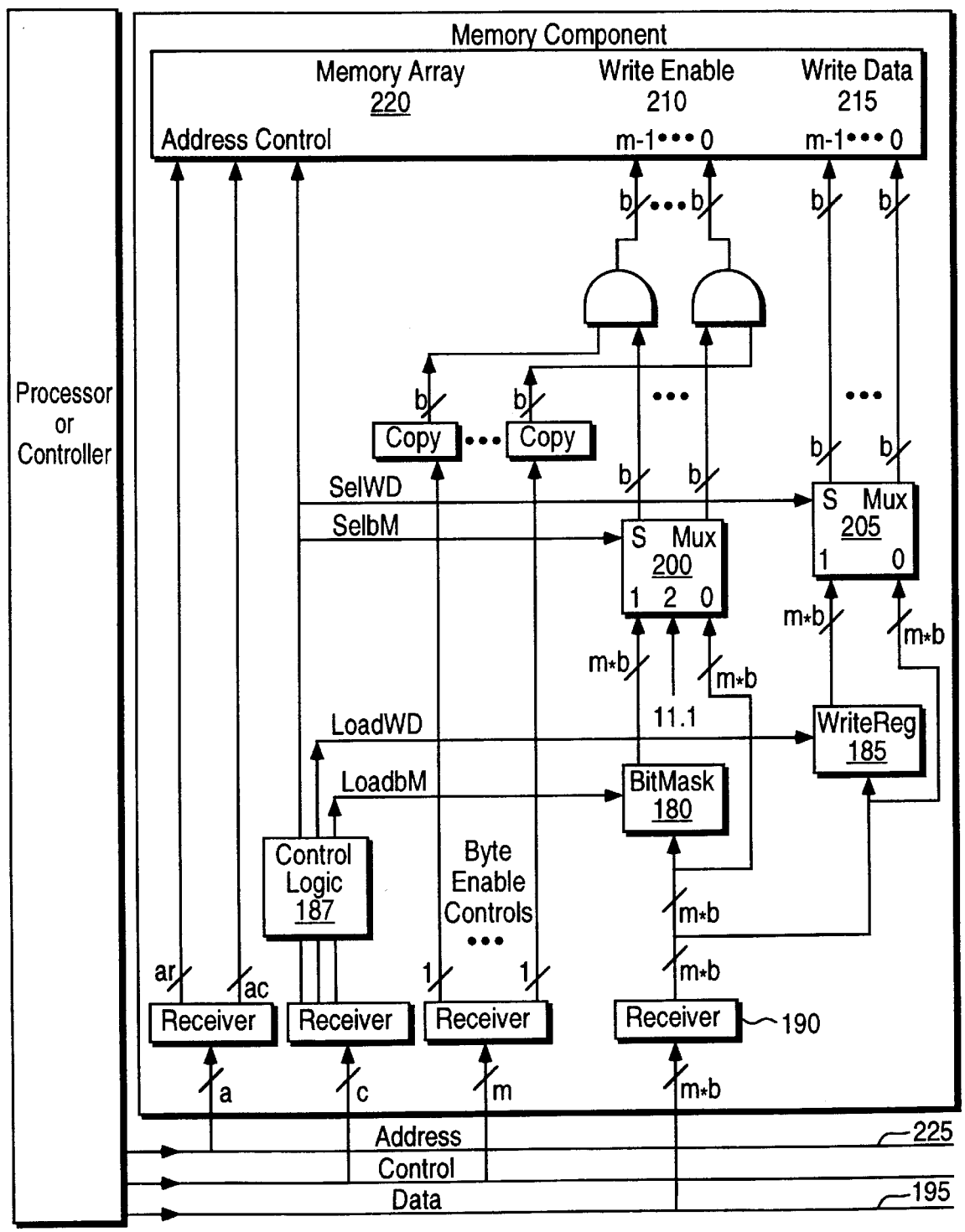
FIG. 8 is a block diagram illustration of one embodiment of the memory system of the present invention.

FIG. 8 is a block diagram of one embodiment. The data paths are similar to those shown in FIG. 5. However, control logic 187, provides the control signals necessary for the data and bit mask transfer as shown by the timing diagrams of FIGS. 9a and 9b.

Figure 9A:
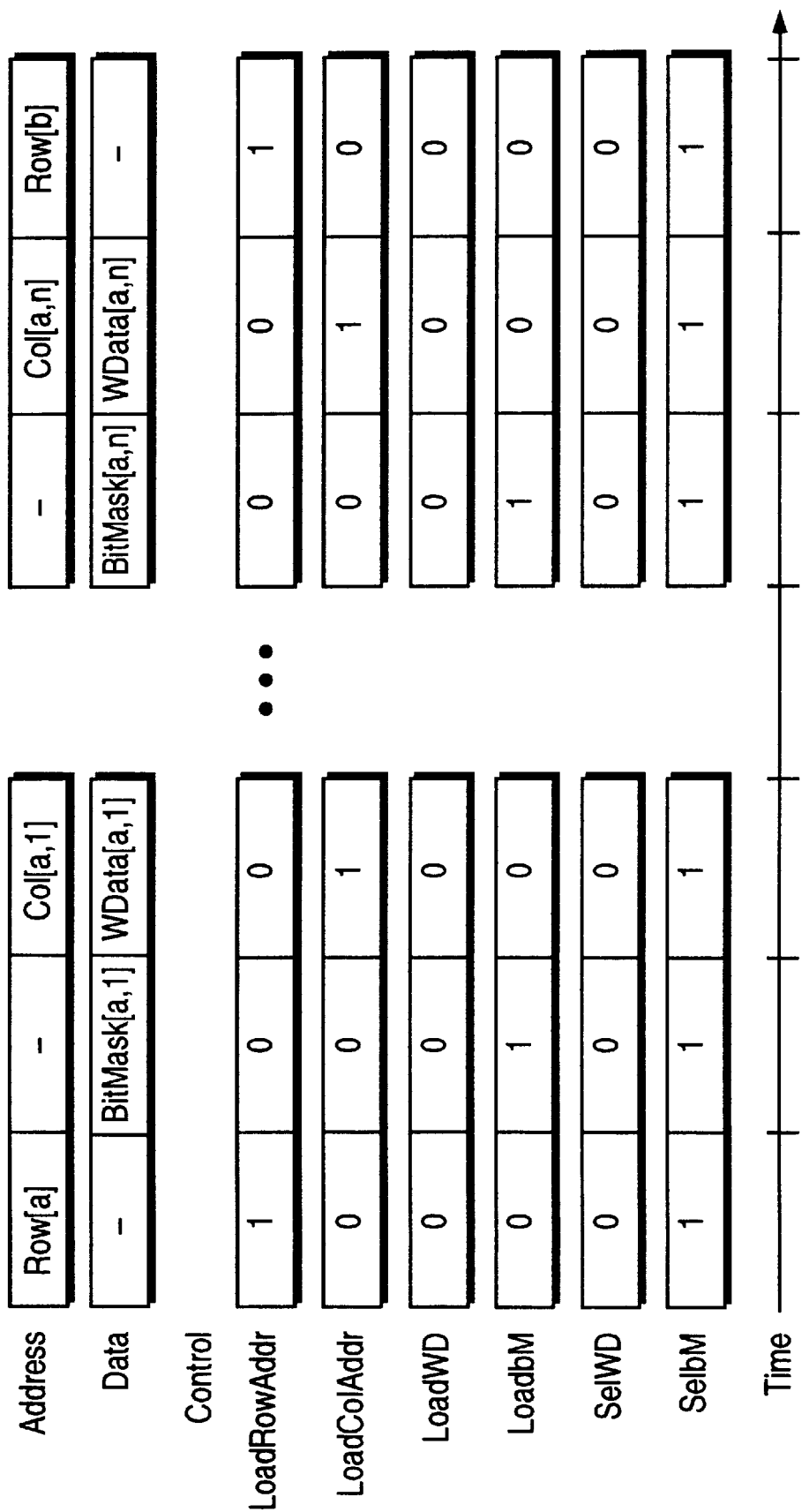

FIGS. 9a and 9b respectively illustrate the timing for two new modes hereinafter referred to as modes seven and eight, in accordance with the teachings of the present invention.

Referring to FIG. 9a, the row address Row[a] is received on the address lines. Prior to the issuance of each column address Col[a,i], a BitMask[a,i] value is received and latched into the BitMask register. When each column address Col[a,i] is received on the address lines, the WData[a,i] value is also received on the Data wires. This WData[a,i] value is held in the receiver, and is subsequently used to drive the write data inputs to the memory array. This two cycle sequence is repeated for "n" different pairs of BitMask and WData values. Each column address can be received during the mask data cycle to provide more time to perform the access.

Mode seven, as illustrated in FIG. 9a, provides a significant performance advantage over, for example, mode two for the situation when a different bit mask must be applied to each piece of data to be written (WriteData) during a write operation. Mode seven of the system of the present invention is able to perform a write operation to the memory array in every two clock cycles of the interface, whereas mode two requires a new row access operation to apply a different bit mask to each piece of WriteData. As is well known in the art, a new row access typically takes four to eight times as long as a column access.

FIG. 9b illustrates the timing for Mode eight. The row address Row[a], and column addresses Col[a,1]·Col[a,n] are received on the address lines. Prior to receipt of each column address Col[a,i], a WData[a,i] value is received on the data lines and latched into the WriteReg register. When each column address Col[a,i] is received on the address lines, the BitMask[a,i] value is also received on the data lines. This value is held in the receiver, and drives the write enable inputs of the memory array. This two cycle sequence is repeated for "n" different pairs of WData and BitMask. The column address can be received when the write data is received, thereby providing more time to perform the access.

Mode eight is thus very similar to mode seven, with the only difference being the order in which BitMask and WData are supplied in each column write cycle. Thus, the same performance advantages are realized.

There are several trends in memory component design which will affect the techniques used for write control. These trends include the increase of interface speed (receivers and transmitters) relative to the speed of the memory array, and the multiplexing of control information onto data lines.

Figure 10:
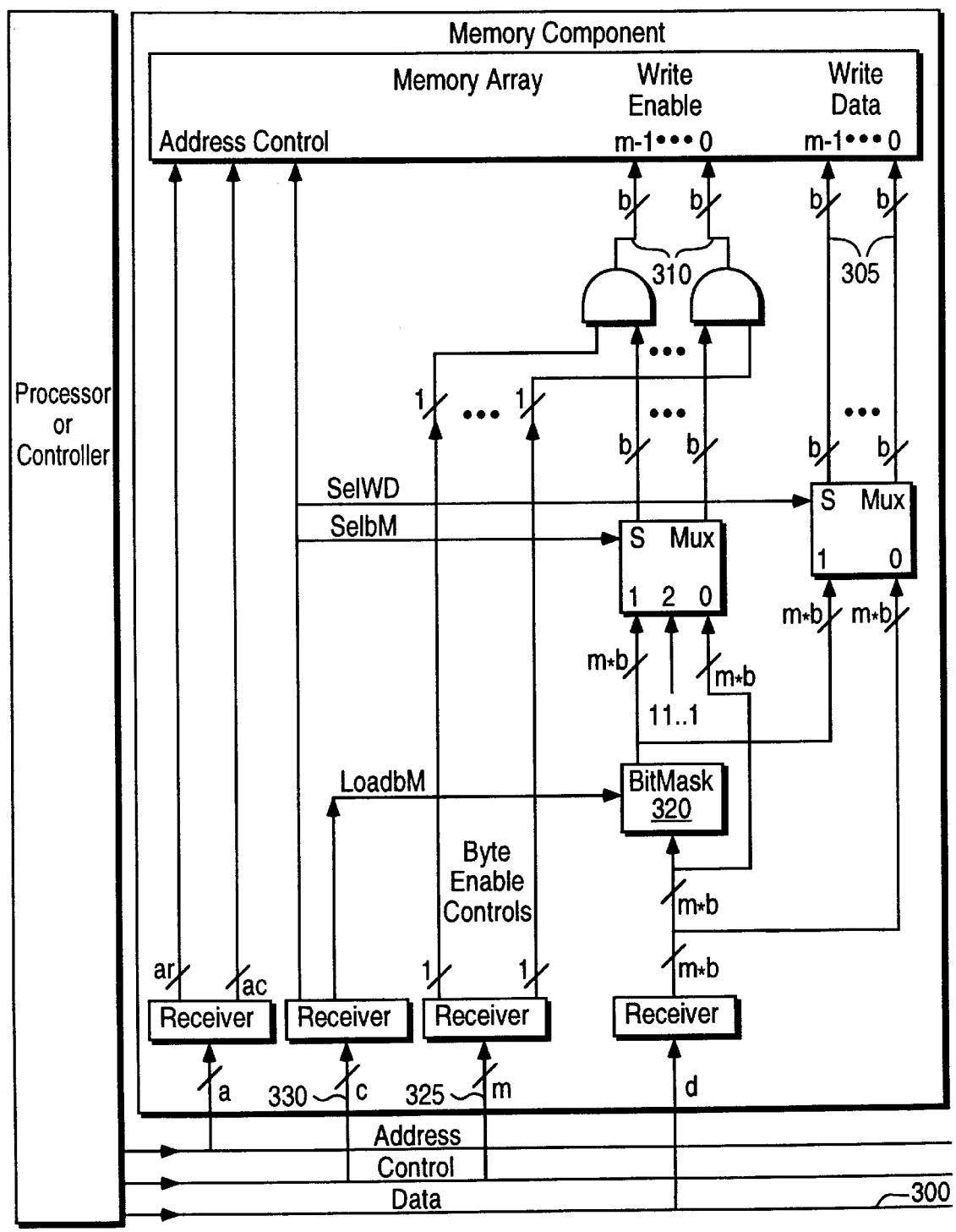
FIG. 10 is a block diagram illustration of one embodiment of the memory system of the present invention.

FIG. 10 illustrates a memory array and interface circuit. Referring to FIG. 10, the impact of increasing interface speed on a memory component can be shown. The number of data lines (d) 300 is less than the number of write data and write enable lines 305, 310 (m*b). The ratio of m*b/d is the same as the ratio of the cycle time of the memory array compared to the bit transmission across a time of a data line. With an aggressive interface technology this ratio might be eight or greater.

The greater the ratio, the larger the size of the BitMask and WriteReg registers. One optimization is to combine the two registers into a single BitMask register 320. At any time, this register holds either the bit mask or write data. Any drawbacks incurred for combining the registers is far outweighed by the space savings and cost savings enjoyed by eliminating a register.

As more information is written during each memory array cycle, it is also important to provide enough byte enable controls. This may be done, as before, by using "m" 325 control lines as dedicated byte enable control signals. This permits the most flexible control for applications requiring the manipulation of byte-sized quantities of information.

However, some memory components may not be able to dedicate "m" control lines for this control function. Instead, referring to FIG. 11, the byte mask control signals are multiplexed on the data lines 300 (like the bit mask controls). A byte mask register 380, is provided which enables a static set of byte enable signals to be loaded and used on multiple sets of write data during write operations by controlling the load byte mask (LoadBM) and select byte mask (SelBM) signals. Alternatively, a byte mask of m*q bits may be loaded into the byte mask register 380 prior to receiving each "q" (where q can be typically equal to b or b−1, depending upon implementation) blocks of m*b write data bits, since each byte mask bit controls "b" write data bits. It should be noted that, in the present embodiment, a multiplexer 390 with "q+1" inputs of "m" bits each is needed in order to select the proper byte mask for each block of data (and to also provide for selectively bypassing the byte mask and forcing all ones). It should be apparent that one can generate byte enable signals utilizing a compact encoding such as providing only the starting address and length information. Compact encoding technique can be applied to all embodiments. It should also be apparent that by storing values in both the bit mask and write data registers, and using those values multiple times with different addresses (under control of internal control logic), large bandwidth savings are permitted.

Figure 11:
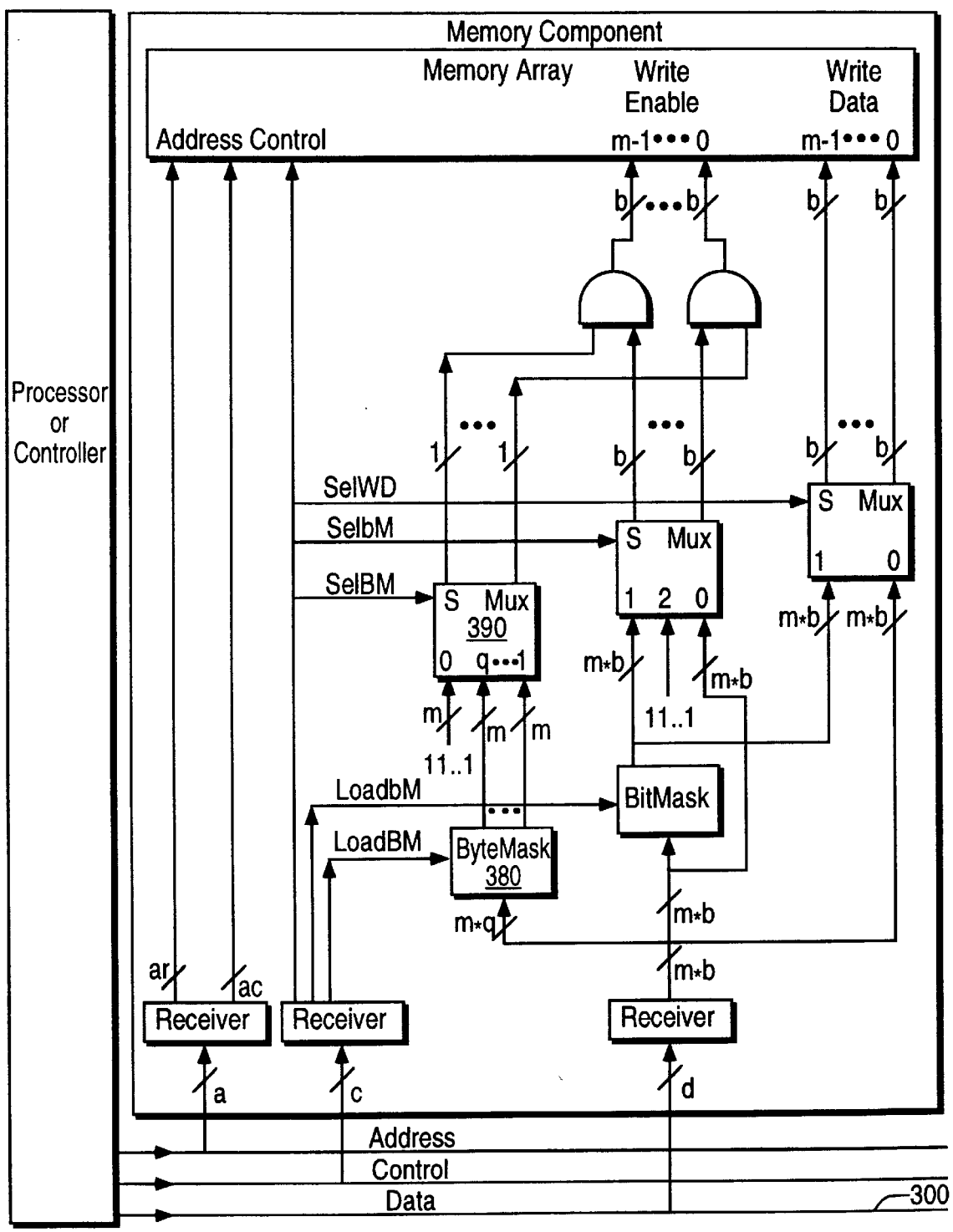
FIG. 11 is a block diagram illustration of an alternate embodiment of the memory system of the present invention.

FIG. 12 illustrates the timing of a write operation in accordance with operating mode twenty one using the byte mask register as illustrated in the embodiment of FIG. 11. This operating mode can be viewed as an extension of operating mode one, wherein an additional clock cycle is used to transmit the byte mask. A row address is received in the first clock cycle. In the next cycle an "m*q" bit value ByteMask[a] is loaded into the byte mask register. In the next "q" column write accesses, a value WData[a,i] is received and driven to the write data inputs of the Memory Array. In each write access, one of the "q" values (each of which are "m" bits wide) is selected from the byte mask register and applied to the write enable inputs of the memory array.

Although a clock cycle is added to load the byte mask register, reducing the data bandwidth by ¹⁄q, "m" byte enable control pins have been saved. In addition, the controller is relieved of the burden of merging the bit and byte masks. In a similar manner, operating modes two, six, seven, and eight can be extended to add a cycle to load the ByteMask register with a byte mask prior to every "q" column write accesses, thereby providing new operating modes 22 through 28.

In two-dimensional graphics systems it is advantageous to be able to write one of two color values into each pixel under control of a select mask. The two color values represent a foreground and a background color. The select mask chooses one of the two colors.

Figure 13:
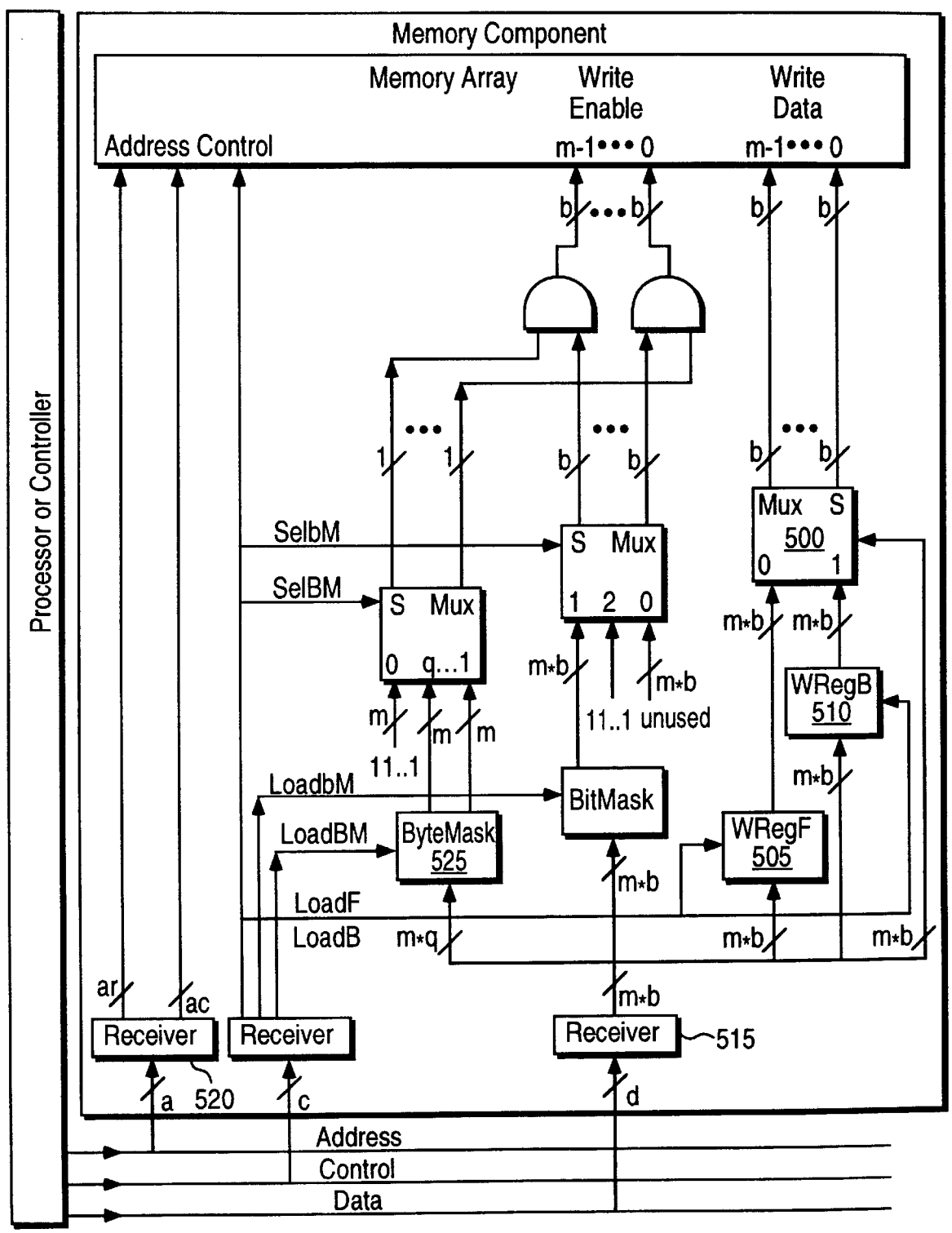
FIG. 13 is a block diagram illustration of an alternate embodiment of the memory system of the present invention.
Figure 14:
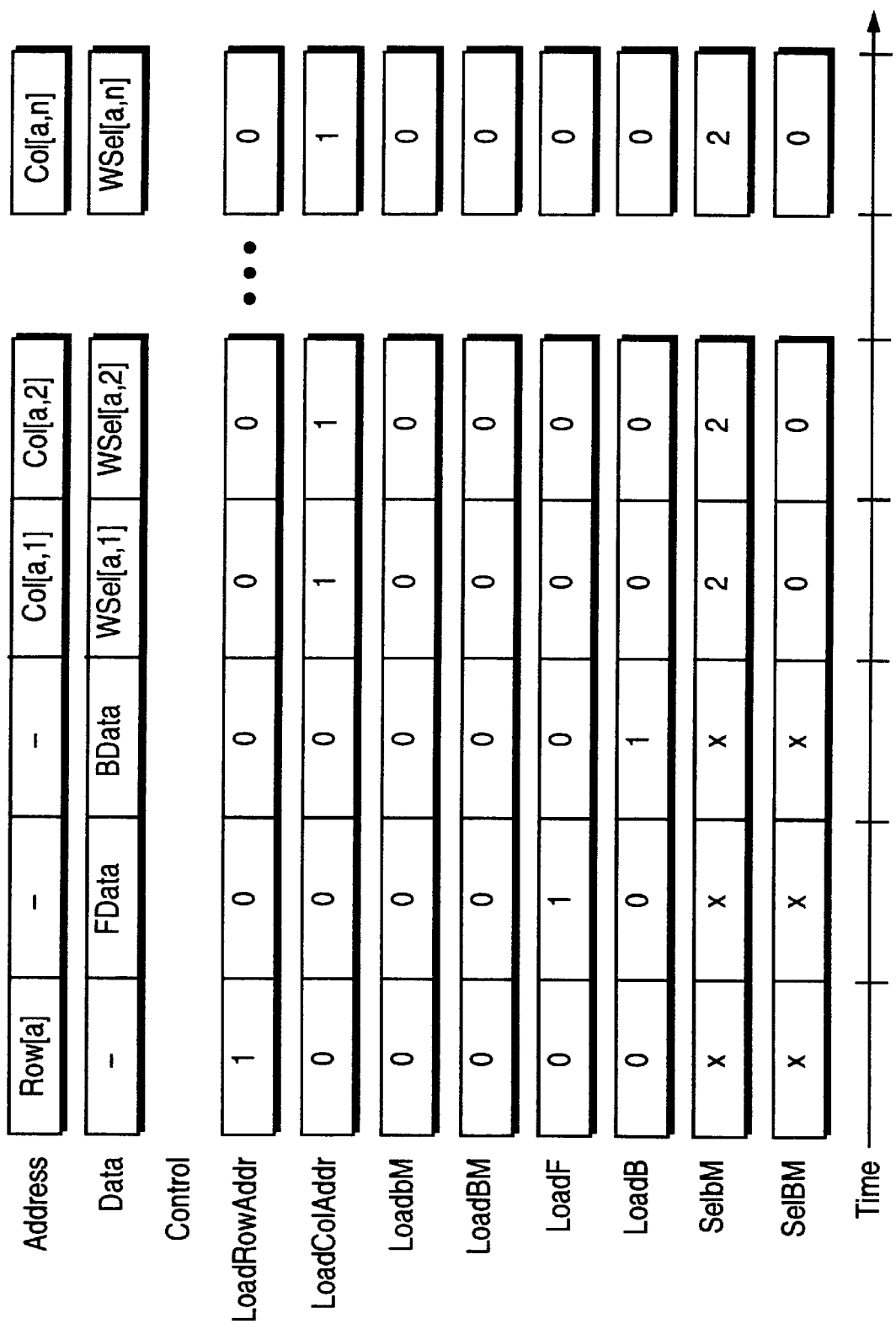
FIG. 14 illustrates the timing for one mode of the embodiment shown in FIG. 13.

FIG. 13 illustrates an embodiment of the memory system of the present invention which provides this capability. The multiplexer 500 receives "m*b" bits from the WRegF 505 and WRegB 510 registers, and gets "m*b" select bits from the data receiver 515. FIG. 14 illustrates the timing of the memory system of the present invention operating in mode one using the two registers 505, 510. Referring to FIGS. 13 and 14, a row address is received by receiver 520 in the first cycle. In the next cycle an "m*b" bit value foreground color is loaded into the WRegF register 505. In the following cycle an "m*b" bit value background color is loaded into the WRegB register 510. In the next "n" column write accesses, a value WSel[a,i] is received and selects between the two color values on a bit-by-bit basis. Although no bitmask or bytemask is used in the above example, as shown in FIG. 13, the system is extendible to handle the additional functionality.

In a similar manner, operating modes two through eight can also be extended to include the two color registers and select signals, resulting in new modes through 108.

FIG. 15 summarizes all the writing mode combinations that have been discussed, as well as all other combinations that have been implied. The first eight modes include the prior art writing modes and new extensions described earlier. Modes 11–18 are similar to modes 1–8, except that the byte mask is supplied by a single internal register rather than control inputs, as shown in FIG. 10. Likewise, in modes 21–28, the byte mask is supplied by the data input signal lines, interleaved with data input, as shown in FIG. 12, for other functions.

Modes 101, 102, 107, and 108 are similar to modes 1, 2, 7, and 8 except that the write data is supplied by two internal color registers and select information from the data inputs (combinations 3, 4, 5, and 6 are not applicable since the write data is not dependent upon the data input in these cases). Likewise, modes 111 through 118 are similar to modes 11 through 18 with the difference in the source of the write data, and modes 121 through 128 are similar to modes 21 through 28. Modes 201 through 628 permute the WDataF, WDataB, and WSelect sources through all relevant combinations.

The invention has been described in conjunction with a preferred embodiment. It is evident that numerous alternatives, modifications, variations and uses will be apparent to those skilled in the art in light of the foregoing description.

What is claimed is:

1. A method for writing data to a memory array, comprising the steps of:

(a) addressing a row of data in the memory array;
   (b) sensing the addressed row of data for storage in a set of sense amplifiers;
   (c) issuing a first bit mask;
   (d) issuing first write data to be written to the memory array;
   (e) addressing a first column of the sensed row of data;
   (f) writing the first write data to the addressed first column of the sensed row of data in accordance with the first bit mask;
   (g) issuing a second bit mask while the addressed row of data is stored in the set of sense amplifiers;
   (h) issuing, while the addressed row of data is stored in the set of sense amplifiers, second write data to be written to the memory array;
   (i) addressing a second column of the stored row of data; and (j) writing the second write data to the addressed second column of the sensed row of data in accordance with the second bit mask.

2. The method of claim 1, wherein the first bit mask issuing step (c) is performed during the first column addressing step (e), and
wherein the first write data issuing step (d) is performed prior to the first bit mask issuing step (c).

3. The method of claim 1, wherein the first write data issuing step (d) is performed during the first column addressing step (e), and
wherein the first bit mask issuing step (c) is performed prior to the first write data issuing step (d).

4. The method of claim 1, wherein the first bit mask issuing step (c) comprises the step of issuing the first bit mask over a data bus for storage in a bit mask memory, and
wherein the first write data issuing step (d) comprises the step of issuing the first write data over the data bus in order to write the first write data to the addressed first column in accordance with the first bit mask stored in the bit mask memory.

5. The method of claim 1, wherein the first write data issuing step (d) comprises the step of issuing the first write data over a data bus for storage in a write memory, and
wherein the first bit mask issuing step (c) comprises the step of issuing the first bit mask over the data bus in order to write the first write data from the write memory to the addressed first column in accordance with the first bit mask.

6. The method of claim 1, comprising the steps of:
issuing a selected one of the first bit mask and the first write data over a data bus for storage in a register; and
issuing a non-selected one of the first bit mask and the first write data over the data bus in order to write the first write data to the addressed first column in accordance with the first bit mask.

7. The method of claim 1, wherein the first write data issuing step (d) comprises the step of selectively issuing first color data and second color data on a bit-by-bit basis.

8. The method of claim 1, wherein the first write data has m bytes of b bits of data, wherein m is a positive integer greater than or equal to one and b is a positive integer greater than or equal to eight.

9. The method of claim 8, wherein the first bit mask has m bytes of b bits of data for masking the first write data.

10. The method of claim 1, comprising the step of issuing a byte mask, and
wherein the writing step (f) comprises the step of writing the first write data to the addressed first column in accordance with the byte mask and in accordance with the first bit mask.

11. The method of claim 10, wherein the byte mask issuing step comprises the step of issuing the byte mask over a data bus for storage in a byte mask memory in order to write the first write data to the addressed first column in accordance with the byte mask stored in the byte mask memory and in accordance with the first bit mask.

12. A method for writing data to a memory component having an array of storage cells arranged in rows and columns, comprising the steps of:
the memory component initially receiving on its address lines a row address specifying a row in the storage array to be sensed and held in a set of sense amplifiers; and
the memory component subsequently performing a first bit masked write operation comprising the steps of:
the memory component receiving on address lines a first column address specifying a first column in the storage array;
the memory component receiving first write data on data lines during the receiving of the first column address;
the memory component receiving a first bit mask on the data lines prior to the receiving of the first write data; and
writing the first write data into the array starting at the received first column address in accordance with the first bit mask.

13. The method of claim 12, wherein the first bit mask is received during the receiving of the first column address.

14. The method of claim 12, further comprising the step of subsequently performing a second bit masked write operation for the addressed row, the second bit masked write operation comprising the steps of:
the memory component receiving on the address lines a second column address specifying a second column in the storage array;
the memory component receiving second write data on the data lines during the receiving of the second column address;
the memory component receiving a second bit mask on the data lines prior to the receiving of the second write data; and
writing the second write data into the array starting at the received second column address in accordance with the second bit mask.

15. A method for writing data to a memory component having an array of storage cells arranged in rows and columns, comprising the steps of:
the memory component initially receiving on its address lines a row address specifying a row in the storage array to be sensed and held in a set of sense amplifiers; and
the memory component subsequently performing a first bit masked write operation comprising the steps of:
the memory component receiving on address lines a first column address specifying a first column in the storage array;
the memory component receiving a first bit mask on data lines during the receiving of the first column address;
the memory component receiving first write data on the data lines prior to the receiving of the first bit mask; and
writing the first write data into the array starting at the received first column address in accordance with the first bit mask.

16. The method of claim 15, wherein the first write data is received during the receiving of the first column address.

17. The method of claim 15, further comprising the step of subsequently performing a second bit masked write operation while the row addressed row is held in the set of sense amplifiers, the second bit masked write operation comprising the steps of:
the memory component receiving on the address lines a second column address specifying a second column in the storage array;
the memory component receiving a second bit mask on the data lines during the receiving of the second column address;
the memory component receiving second write data on the data lines prior to the receiving of the second bit mask; and
writing the second write data into the array starting at the received second column address in accordance with the second bit mask.

18. The method of claim 15 wherein:
when the memory component operates in a first mode, the method further comprises the steps of:
storing the first bit mask in a register;
providing the first write data from the data lines to the memory array without storing the first write data in the register; and
when the memory component operates in a second mode, the method further comprises the steps of:
storing the first write data in the register;
providing the first bit mask from the data lines to the memory array without storing the first bit mask in the register.

19. The method of claim 15, wherein the first write data has m bytes of b bits of data, wherein m is a positive integer greater than or equal to one and b is a positive integer greater than or equal to eight.

20. The method of claim 19, wherein the first bit mask has m bytes of b bits of data for masking the first write data.

21. The method of claim 15, comprising the step of issuing a byte mask, and
wherein the writing step includes writing the first write data into the array of storage cells in accordance with the byte mask and the first bit mask.

22. The method of claim 21, wherein the byte mask issuing step comprises the step of issuing the byte mask over the data bus for storage in a byte mask memory.

23. A memory device comprising:
a memory array including a plurality of sense amplifiers; and
a memory interface coupled to the memory array, the memory interface configured to initially receive a row address specifying a row in the memory array to be sensed and held in the plurality of sense amplifiers, the memory interface further configured to subsequently receive write data, a column address, and a bit mask, and wherein the memory interface is configured to write the write data into the memory array starting at the column address and in accordance with the bit mask.

24. The memory device of claim 23, wherein the write data is received when the column address is received, and wherein the bit mask is received before the write data and the column address.

25. The memory device of claim 23, wherein the bit mask is received when the column address is received, and wherein the write data is received before the bit mask and the column address.

26. A memory device comprising:
a memory array having rows, columns, and a plurality of sense amplifiers;
means for receiving a row address specifying a row in the memory array to be sensed and held in the plurality of sense amplifiers;
a memory interface coupled to the memory array and for performing a bit masked write operation after the receiving means receives the row address, the memory interface comprising:
means for concurrently receiving a column address specifying a column in the memory array and write data;
means for receiving a bit mask prior to the receiving of the write data; and
means for writing the write data into the memory array starting at the received column address in accordance with the bit mask.

27. A memory device comprising:
a memory array having rows, columns, and a plurality of sense amplifiers;
means for receiving a row address specifying a row in the memory array to be sensed and held in the plurality of sense amplifiers;
a memory interface coupled to the memory array and for performing a bit masked write operation after the receiving means receives the row address, the memory interface comprising:
means for concurrently receiving a column address specifying a fist column in the memory array and a bit mask;
means for receiving write data prior to the receiving of the bit mask; and
means for writing the write data into the memory array starting at the received column address in accordance with the bit mask.

28. A method for writing data to a memory component having a static storage array of static storage cells arranged in rows and columns, comprising the steps of:
the memory component receiving on its address lines a row address specifying a row in the static storage array to be sensed and held in a set of sense amplifiers; and
the memory component performing a bit masked write operation comprising the steps of:
the memory component receiving on address lines a column address specifying a column in the static storage array;
the memory component receiving write data on data lines during the receiving of the column address;
the memory component receiving a bit mask on the data lines prior to the receiving of the write data; and
writing the write data into the static storage array starting at the received column address in accordance with the bit mask.

29. A method for writing data to a memory component having a static storage array of static storage cells arranged in rows and columns, comprising the steps of:
the memory component receiving on its address lines a row address specifying a row in the static storage array to be sensed and held in a set of sense amplifiers; and
the memory component performing a bit masked write operation comprising the steps of:
the memory component receiving on address lines a column address specifying a column in the static storage array;
the memory component receiving a bit mask on data lines during the receiving of the column address;
the memory component receiving write data on the data lines prior to the receiving of the bit mask; and
writing the write data into the static storage array starting at the received column address in accordance with the bit mask.

30. The method of claim 12 wherein:
when the memory component operates in a first mode, the method further comprises the steps of:
storing the first bit mask in a register;
providing the first write data from the data lines to the memory array without storing the first write data in the register; and
when the memory component operates in a second mode, the method further comprises the steps of:
storing the first write data in the register;
providing the first bit mask from the data lines to the memory array without storing the first bit mask in the register.

31. The method of claim 12, wherein the first write data has m bytes of b bits of data, wherein m is a positive integer greater than or equal to one and b is a positive integer greater than or equal to eight.

32. The method of claim 31, wherein the first bit mask has m bytes of b bits of data for masking the first write data.

33. The method of claim 12, comprising the step of issuing a byte mask, and wherein the writing step includes writing the first write data into the array of storage cells in accordance with the byte mask and the first bit mask.

34. The method of claim 33, wherein the byte mask issuing step comprises the step of issuing the byte mask over the data bus for storage in a byte mask memory.

35. A memory system, comprising:

a memory array having address inputs, a number of mask inputs, and a number of data inputs; and a memory interface, coupled to the memory array, for issuing a row address to the address inputs to sense a row of data in the memory array;

the memory interface comprising:

(i) a register, and (ii) control circuitry coupled to the register, the mask inputs, and the data inputs, the control circuitry configured to store in the register a selected one of a bit mask and write data to be written to the memory array, the register storing the bit mask in a first operating mode, and the write data in a second operating mode, the control circuitry also configured to issue the bit mask to the mask inputs from either a data bus or the register and configured to issue the write data to the data inputs from either the data bus or the register in order to write the write data to the sensed row of data in accordance with the bit mask.

36. The memory system of claim 35, wherein the write data has m bytes of b bits of data, wherein m is a positive integer greater than or equal to one and b is a positive integer greater than or equal to eight.

37. The memory system of claim 36, wherein the bit mask has m bytes of b bits of data for masking the write data.

38. The memory system of claim 35, wherein the control circuitry issues a byte mask in order to write the write data to the sensed row of data in accordance with the byte mask and in accordance with the bit mask.

39. The memory system of claim 38, wherein the memory interface comprises a byte mask memory for storing the byte mask, the control circuitry issuing the byte mask from the byte mask memory in order to write the write data to the sensed row of data in accordance with the byte mask and in accordance with the bit mask.

40. The memory system of claim 35, wherein the control circuitry further comprises a first receiver coupled to the register, the first receiver having:

a number of inputs configured to receive the bit mask and write data, wherein the number of inputs is less than the number of mask inputs and the number of write data inputs of the memory array; and a number of outputs configured to provide the bit mask or write data to the register, wherein the number of outputs is greater than the number of inputs.

41. The memory system of claim 40, wherein the number of outputs of the first receiver is equal to the number of mask inputs of the memory array.

42. The memory system of claim 40, wherein the number of outputs of the first receiver is equal to the number of data inputs of the memory array.

43. The memory system of claim 40, wherein the memory array has a memory cycle time and the ratio of the number of data inputs of the memory array to the number inputs of the first receiver is the same ratio as the memory array cycle time to a bit transmission rate of the data bus.

44. The memory system of claim 40, wherein the memory array has a memory cycle time and the ratio of the number of mask inputs of the memory array to the number inputs of the first receiver is the same ratio as the memory array cycle time to a bit transmission rate of the data bus.

45. The memory system of claim 40, wherein the control circuitry further comprises:

a second receiver configured to receive a plurality of control signals;

a first multiplexer having a first input coupled to the outputs of the register, a second input coupled to the first receiver, a control input configured to receive one of the plurality of control signals from the second receiver, and an output coupled to the mask inputs; and a second multiplexer having a first input coupled to the outputs of the register, a second input coupled to the first receiver, a control input configured to receive one of the plurality of control signals from the second receiver, and an output coupled to the data inputs.

* * * * *